(12) United States Patent
Fukuda et al.

(10) Patent No.: US 8,482,194 B2
(45) Date of Patent: Jul. 9, 2013

(54) DISPLAY APPARATUS HAVING A CIRCULAR POLARIZER

(75) Inventors: Koichi Fukuda, Tokyo (JP); Rei Kurashima, Mobara (JP); Hideo Mori, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 159 days.

(21) Appl. No.: 12/777,136

(22) Filed: May 10, 2010

(65) Prior Publication Data
US 2010/0289038 A1 Nov. 18, 2010

(30) Foreign Application Priority Data

May 13, 2009 (JP) ................. 2009-116607

(51) Int. Cl.
*H05B 33/00* (2006.01)
*H05B 33/02* (2006.01)

(52) U.S. Cl.
USPC .............. 313/506; 313/503; 313/504

(58) Field of Classification Search
USPC ................................ 313/504–506
See application file for complete search history.

(56) References Cited

U.S. PATENT DOCUMENTS

| 7,176,621 B2 * | 2/2007 | Do et al. ................ 313/506 |
| 2002/0180348 A1 | 12/2002 | Oda |
| 2005/0088084 A1 * | 4/2005 | Cok ................ 313/506 |
| 2006/0186802 A1 * | 8/2006 | Cok et al. ................ 313/506 |
| 2006/0192483 A1 * | 8/2006 | Nakanishi et al. ............ 313/504 |
| 2007/0290607 A1 * | 12/2007 | Okada et al. ................ 313/504 |

FOREIGN PATENT DOCUMENTS

JP   11-283751 A   10/1999

* cited by examiner

*Primary Examiner* — Sikha Roy
(74) *Attorney, Agent, or Firm* — Canon U.S.A., Inc. IP Division

(57) ABSTRACT

A display apparatus includes a light emitting device emitting red light, a light emitting device emitting green light, and a light emitting device emitting blue light. The display apparatus includes a circular polarizer provided on the light extraction side of the light emitting devices. Each light emitting device includes a periodic structure for extracting light from the light extraction side of the light emitting device, the light being generated in a light emitting layer and guided in the in-plane direction of a substrate. Each period of the periodic structure of the light emitting devices is identical, and the period of the periodic structure is more than 200 nm and 380 nm or less.

14 Claims, 4 Drawing Sheets

DISPLAY APPARATUS HAVING A CIRCULAR POLARIZER

BACKGROUND OF THE INVENTION

1. Field of the Invention

The present invention relates to a display apparatus and, in particular, to a display apparatus having enhanced light extraction efficiency and good photopic contrast.

2. Description of the Related Art

Organic EL devices (light emitting devices) are characterized by the fact that they utilize spontaneous light emission from thin films and are used in a new type of flat-panel displays. Such an organic EL device includes a pair of electrodes constituted by a cathode and an anode and an organic compound layer formed between the pair of electrodes. Light emission from such an organic EL device employs a principle in which a molecule emits light upon transition from an excited state to the ground state. Specifically, electrons are injected from the cathode and holes are injected from the anode into the organic compound layer to thereby generate excitons in the light emitting layer in the organic compound layer. The excitons bring molecules in the light emitting layer into the excited state. The molecules emit light upon transition from the excited state to the ground state. Such a light emitting layer is composed of a light emitting material such as a fluorescent organic compound, a phosphorescent organic compound, or a quantum dot.

To enhance the visibility of organic EL devices outdoors, it is important to improve the photopic contrast of organic EL devices. A means for improving the photopic contrast is to suppress reflection of ambient light and it has been proposed to place a circular polarizer on the light extraction side of such an organic EL device. Another means for improving the photopic contrast is to enhance the light emission efficiency to thereby increase the maximum luminance of light emission. Japanese Patent Laid-Open No. 11-283751 discloses an organic EL device including a periodic structure (diffraction grating) disposed in an upper portion or a lower portion of an organic compound layer (that is, the light extraction side of the device or the side opposite to the light extraction side) for the purpose of reducing confinement of light generated in the device and enhancing the light emission efficiency.

However, when an organic EL device has a configuration in which these two features are combined, that is, when a periodic structure is provided in an organic EL device equipped with a circular polarizer, the following problem is caused. The periodic structure disturbs the circular polarization state of ambient light having entered the device through the circular polarizer and the function of suppressing reflection of ambient light is degraded, the function being provided by the circular polarizer.

This problem is not restricted to organic EL devices and light emitting devices including circular polarizers and periodic structures such as diffraction gratings also suffer from such a problem.

SUMMARY OF THE INVENTION

The present invention provides a display apparatus having high light extraction efficiency and a good function of suppressing reflection of ambient light.

A display apparatus according to the present invention includes a substrate and a plurality of light emitting devices provided on the substrate and including a first electrode, a second electrode on a light extraction side of the light emitting devices, a light emitting layer between the first electrode and the second electrode, a periodic structure for extracting light generated in the light emitting layer from the light extraction side of the light emitting devices, and a circular polarizer provided on the light extraction side of the light emitting devices, wherein the plurality of light emitting devices include a light emitting device emitting red light, a light emitting device emitting green light, and a light emitting device emitting blue light, each period of the periodic structure of the plurality of light emitting devices is identical, and the period of the periodic structure is more than 200 nm and 380 nm or less.

The present invention can provide a display apparatus having high light extraction efficiency and a good function of suppressing reflection of ambient light.

Further features of the present invention will become apparent from the following description of exemplary embodiments with reference to the attached drawings.

DESCRIPTION OF THE EMBODIMENTS

Figure 1A:
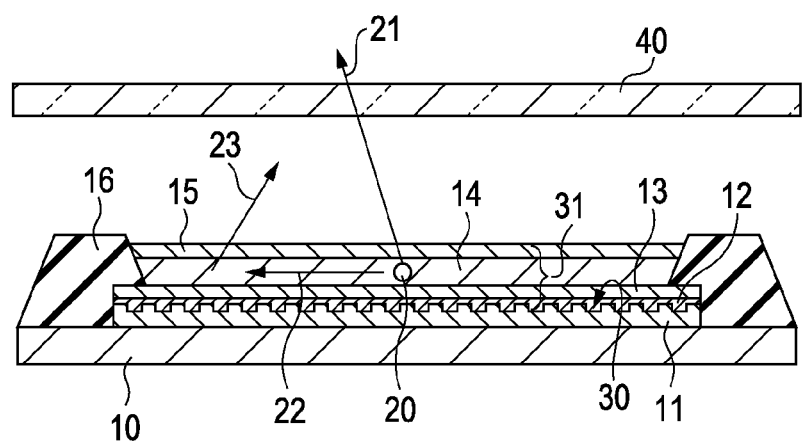
FIG. 1A is a sectional schematic view of a light emitting device used for a display apparatus according to an embodiment of the present invention.

Hereinafter, principles of the present invention will be described on the basis of embodiments. In the present invention, to enhance the light extraction efficiency of a light emitting device, a periodic structure is formed; and to suppress reflection of ambient light, a circular polarizer is placed on the light extraction side of the device. The "periodic structure" is a structure configured to extract light to the outside of the light emitting device, the light being generated in a light emitting layer and guided in the in-plane direction of a substrate. The periodic structure is configured so as to have a period of more than $380/(n+1)$ nm and 380 nm or less where n represents the refractive index of the light emitting layer of the light emitting device.

In the following description, organic EL devices are used as examples of light emitting devices according to the present invention. However, the present invention may also employ inorganic EL devices having periodic structures, QD-LED devices including light emitting layers composed of quantum dots (QDs), or the like. As for elements and features that are not particularly illustrated in the drawings or described in this specification, well-known or known techniques in the technical field are employed.

FIG. 1A is a sectional schematic view illustrating the configuration of an organic EL device (hereinafter, sometimes referred to as a device) according to an embodiment of the present invention. The organic EL device in FIG. 1A includes a substrate 10, a reflecting layer 11, a planarizing layer 12, a first electrode 13, an organic compound layer 14, a second electrode 15, a partition wall 16, a periodic structure 30, and a circular polarizer 40. In FIG. 1A, reference numeral 20 denotes a light emitting point; reference numeral 21 denotes propagating light (light that is extracted from the device to the outside); reference numeral 22 denotes guided light (light being made to propagate in the in-plane direction of the substrate 10); and reference numeral 23 denotes diffracted light. The first electrode 13 and the second electrode 15 are transparent or semitransparent electrodes that have optical transmissivity. Note that the phrase "have optical transmissivity" means to have a light transmittance of 50% or more and 100% or less in the maximum peak wavelength in the spectrum of light extracted from a device.

Figure 1B:
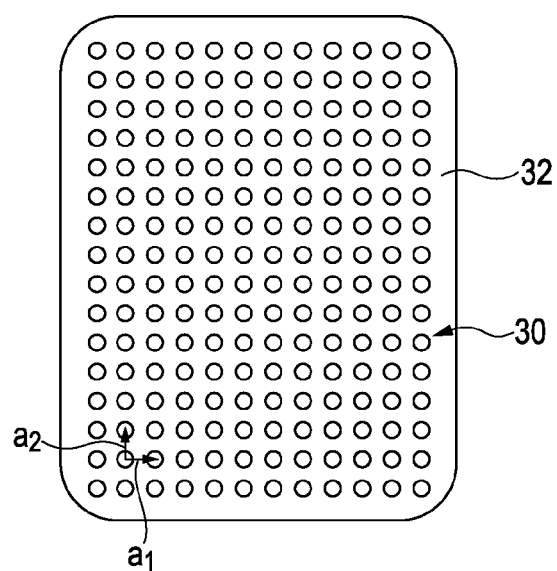
FIG. 1B is a schematic plan view of a light emitting device used for a display apparatus according to an embodiment of the present invention.

FIG. 1B is a sectional schematic view illustrating the configuration of a device according to an embodiment of the present invention. Reference numeral 32 denotes a light emitting region. The device according to the embodiment includes a photonic crystal (periodic structure 30) disposed in the light emitting region 32. In FIG. 1B, two principal lattice vectors defining the period of the periodic structure 30 are defined as $a_1$ and $a_2$. The "light emitting region" is a region where the partition wall is not formed between two electrodes sandwiching the organic compound layer and the light emitting region is a region where one of the electrodes overlaps the other when one of the electrodes is projected upon the other electrode in the direction perpendicular to the substrate.

In the device illustrated in FIG. 1A, the reflecting layer 11 is formed on the substrate 10. The periodic structure 30 is formed in the reflecting layer 11. The periodic structure 30 is covered with the planarizing layer 12 such that a flat surface is formed over the irregularities of the periodic structure 30. In this embodiment, concave portions are periodically formed between the reflecting layer 11 and the planarizing layer 12. However, the periodic structure 30 is not restricted to such a configuration constituted by concave portions. The periodic structure 30 may have a configuration constituted by convex portions or the like. Stated another way, the periodic structure 30 has a configuration in which concave portions and convex portions are periodically arranged in the in-plane direction of the substrate 10. Additionally, the periodic structure 30 is not restricted to the sectional configuration constituted by line segments intersecting with each other at right angles illustrated in FIG. 1A. The periodic structure 30 may have various sectional configurations such as a configuration constituted by tapered portions or a configuration constituted by inverse tapered portions. The planarizing layer 12 may be eliminated when it is not necessary. The periodic structure 30 is a structure in which the refractive index periodically varies in the in-plane direction of the substrate 10. In FIG. 1A, the periodic structure 30 is a structure in which an anode material and the material of the planarizing layer are periodically arranged in the in-plane direction of the substrate 10.

The first electrode 13 (anode) is formed on the planarizing layer 12. The partition wall 16 composed of an insulation material is formed so as to cover the perimeter of the first electrode 13. The organic compound layer 14 including a light emitting layer is formed on the exposed portion of the first electrode 13, the exposed portion being exposed through the opening of the partition wall 16. The second electrode 15 (cathode) is formed on the organic compound layer 14. By applying a voltage or passing a current between the first electrode 13 and the second electrode 15, the light emitting layer disposed between the first electrode 13 and the second electrode 15 emits light. Although the first electrode 13 is used as an anode and the second electrode 15 is used as a cathode in the above-described configuration, the first electrode 13 and the second electrode 15 may be respectively used as a cathode and an anode.

The light emitting device of this embodiment has a reflecting plane closer to the first electrode 13 with respect to the light emitting layer. The reflecting plane is the interface between the reflecting layer 11 and the planarizing layer 12. When the planarizing layer 12 is not provided, the interface between the reflecting layer 11 and the first electrode 13 serves as the reflecting plane. When the planarizing layer 12 and the first electrode 13 are not provided and the reflecting layer 11 also functions as the first electrode 13, the interface between the reflecting layer 11 and the organic compound layer 14 serves as the reflecting plane. In this case, the second electrode 15 formed on the organic compound layer 14 is an electrode on the light extraction side of the device and light generated in the light emitting layer is extracted from the second electrode 15 side of the device to the outside of the device.

To suppress reflection of ambient light, the circular polarizer 40 is provided on the light extraction side of the light emitting device. However, the function of suppressing reflection of ambient light of the circular polarizer 40 is degraded when a periodic structure is simply provided for the purpose of enhancing light extraction efficiency.

Accordingly, in the present invention, in the above-described configuration, the periodic structure 30 is made to have a period of more than $380/(n+1)$ nm and 380 nm or less where n represents the refractive index of the light emitting layer included in the organic compound layer 14. In this configuration, as described below, the light extraction efficiency is enhanced while the function of suppressing reflection of ambient light of the light emitting device is maintained. Therefore, the present invention can provide a light emitting device having high light extraction efficiency and a good function of suppressing reflection of ambient light.

Period of Periodic Structure

The upper limit of the period of the periodic structure will be described. The upper limit of the period is determined as a condition under which the function of suppressing reflection of ambient light is maintained.

Figure 2A:
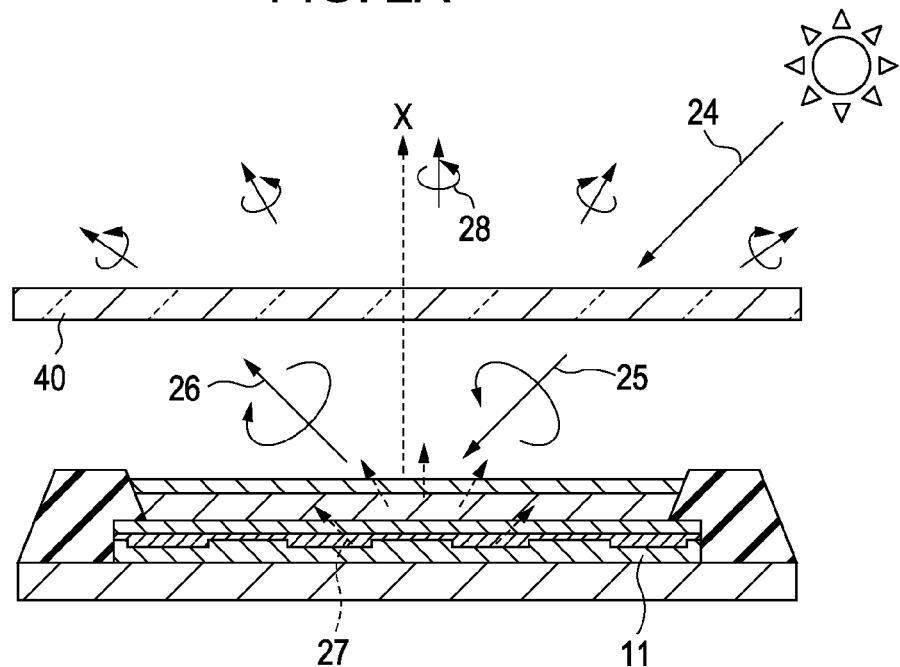
FIG. 2A is a schematic view illustrating a case where the presence of a periodic structure degrades a function of suppressing reflection of ambient light, the function being provided by a circular polarizer.

In general, when a nonplanar light extraction structure such as a periodic structure or a scattering structure for enhancing the light extraction efficiency is provided, the function of suppressing reflection of ambient light of a circular polarizer is degraded. FIG. 2A is a schematic view illustrating such degradation of the function of suppressing reflection of ambient light. Here, consider the case where the circular polarizer 40 allows only right-handed circularly polarized light to pass therethrough and absorbs left-handed circularly polarized light. When the device is exposed to ambient light 24, the circular polarizer 40 allows only right-handed circularly polarized incident light 25 to pass therethrough to the device. Most of the right-handed circularly polarized incident light 25 is reflected an odd number of times at the interfaces of layers of the device and turns into left-handed circularly polarized specularly reflected light 26 and is absorbed by the circular polarizer 40. However, a portion of the right-handed circularly polarized incident light 25 is turned by the light extraction structure into non-circularly polarized light component 27 in which the circular polarization state is disturbed. In particular, when the period of the periodic structure is large compared with the wavelength or a scattering structure is used, the non-circularly polarized light component 27 is emitted at a random angle. The right-handed circularly polarized light component of the non-circularly polarized light component 27, the right-handed circularly polarized light component being about half of the non-circularly polarized light component 27, is not absorbed by the circular polarizer 40 and is extracted as reflected light 28 to the outside of the device. Thus, the reflectivity of ambient light is increased. That is, the function of suppressing reflection of ambient light is degraded. In general, people look at devices from the front side of the devices. Accordingly, it is particularly problematic if light arising from ambient light having entered devices is emitted in the forward direction X (direction substantially perpendicular to the substrate) by the light extraction structure. The term "substantially perpendicular to the substrate" refers to an angle of 85° or more and 90° or less with respect to a plane parallel to the substrate.

Figure 2B:
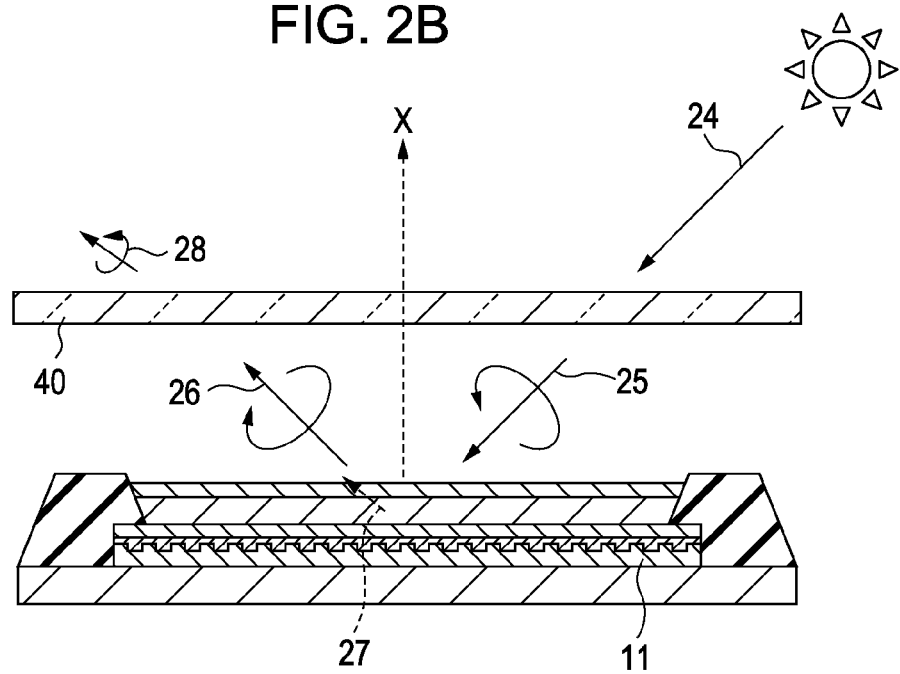
FIG. 2B is a schematic view illustrating a case where the presence of a periodic structure maintains a function of suppressing reflection of ambient light, the function being provided by a circular polarizer.

In contrast, as illustrated in FIG. 2B, when the angle at which the non-circularly polarized light component 27 is emitted is restricted so that the non-circularly polarized light component 27 is emitted in directions other than the forward direction X, a good function of suppressing reflection of ambient light can be achieved. This can be achieved by providing a periodic structure as a light extraction structure and restricting the period of the periodic structure to a period with which only zeroth-order diffracted light (specularly reflected light) is generated from light entering the periodic structure from outside the device. Thus, reflected light that arises from ambient light and is emitted in the forward direction X can be suppressed. Herein, the term "specularly reflected" indicates that light is reflected at a reflection angle equal to the incident angle of the light.

In the device illustrated in FIGS. 1A and 1B, the period of the periodic structure 30 is denoted by a, the refractive index of a light-extraction-side medium (in general, the air) is denoted by $n_{air}$, and the wavelength of ambient light entering the device is denoted by $\Lambda$.

When the incident angle of the ambient light is denoted by $\theta_{amb}$, a diffraction condition under which diffracted light is generated in a direction (visual direction X) substantially perpendicular to the substrate 10 is given from phase matching conditions by Formula 1 where m represents an integer.

$$n_{air}\sin\theta_{amb} = n_{air}\sin 0° + m\frac{\Lambda}{a} \qquad \text{Formula 1}$$

From Formula 1, in all the cases when the incident angle $\theta_{amb}$ of the ambient light satisfies $-90° < \theta_{amb} < 90°$, a condition under which diffracted light is not generated is given by Formula 2. Formula 2 is rewritten as Formula 3. Herein, $n_{air}$ is defined as 1.0.

$$m\frac{\Lambda}{a} \leq -1 (m < 0), \text{ or } 1 \leq m\frac{\Lambda}{a} (m \geq 0) \qquad \text{Formula 2}$$

$$|m|\frac{\Lambda}{a} \geq 1, \forall |m| = 1, 2, 3, \ldots \qquad \text{Formula 3}$$

To maintain the function of suppressing reflection of ambient light, Formula 3 should be satisfied over the entire visible-light region of 380 nm or more and 780 nm or less. Accordingly, the period a of the periodic structure 30 should be 380 nm or less. In the case of a square lattice having a period a ($a_1 = a_2 = a$) as illustrated in FIG. 1B, the period of the diagonal line, which is inclined by 45° with respect to a side of the square lattice, is about 1.4 times the period a. Accordingly, the period a is desirably 270 nm (approximately equals 380/1.4) or less.

Hereinafter, the lower limit of the period a of the periodic structure 30 will be described. The lower limit of the period a is determined on the basis of conditions for enhancing light extraction efficiency. Referring to FIG. 1A, to enhance light extraction efficiency, the periodic structure 30 should generate diffracted light 23 from the guided light 22 propagating in an optical waveguide 31 in a direction parallel to the substrate 10. The effective refractive index with respect to the guided light 22 is denoted by $n_{gm}$. Herein, the effective refractive index $n_{gm}$ satisfies the condition $n_{air} < n_{gm} < n$. The maximum peak wavelength in the spectrum of light extracted from a light emitting device is denoted by $\lambda$. The refractive index of a light emitting layer is denoted by n. A diffraction condition under which diffracted light is generated is given from phase matching conditions by Formula 4 where m represents an integer and $\theta_m$ represents diffraction angle.

$$n_{gm}\sin 90° = n_{air}\sin\theta_m + m\frac{\lambda}{a} \qquad \text{Formula 4}$$

From Formula 4, a condition under which diffracted light is generated is given by Formula 5. Formula 5 is rewritten as Formula 6. Herein, $n_{air}$ is defined as 1.0.

$$-1 - n_{gm} < -m\frac{\lambda}{a} < 1 - n_{gm} < 0, (m = 1, 2, 3, \ldots) \qquad \text{Formula 5}$$

$$\frac{m\lambda}{n_{gm} + 1} < a < \frac{m\lambda}{n_{gm} - 1} \qquad \text{Formula 6}$$

From Formula 6 and the condition $n_{air} < n_{gm} < n$, to generate diffracted light from guided light, the condition of Formula 7 is necessary. Furthermore, when at least m=1, the light extraction efficiency is enhanced. Thus, Formula 7 is rewritten into the condition formula of Formula 8.

$$\frac{m\lambda}{n+1} < a, \exists m = 1, 2, 3, \ldots \qquad \text{Formula 7}$$

$$\frac{\lambda}{n+1} < a \qquad \text{Formula 8}$$

Since the advantageous effect of enhancing the light extraction efficiency should be provided in any point in the visible-light region of 380 nm or more and 780 nm or less, the periodic structure 30 should be configured so as to have a period a of more than 380/(n+1) nm. In general, organic EL devices include light emitting layers having a refractive index n of about 1.6 to 2.0. Accordingly, the period a of the periodic structure 30 is desirably more than 125 nm.

Thus, by making the periodic structure 30 to have a period a of more than 380/(n+1) nm and 380 nm or less where n represents the refractive index of the light emitting layer included in the organic compound layer 14, a light emitting device having high light extraction efficiency and a good function of suppressing reflection of ambient light can be provided.

The configuration in which the periodic structure is provided in the reflecting plane closer to the first electrode with respect to the light emitting layer has been described. Alternatively, the periodic structure may be provided on the second electrode side of the device, that is, the light extraction side of the device. Specifically, a configuration in which the periodic structure constituted by a metal thin film is provided on the side of the second electrode, the side being opposite the light emitting layer, may be employed.

Figure 3:
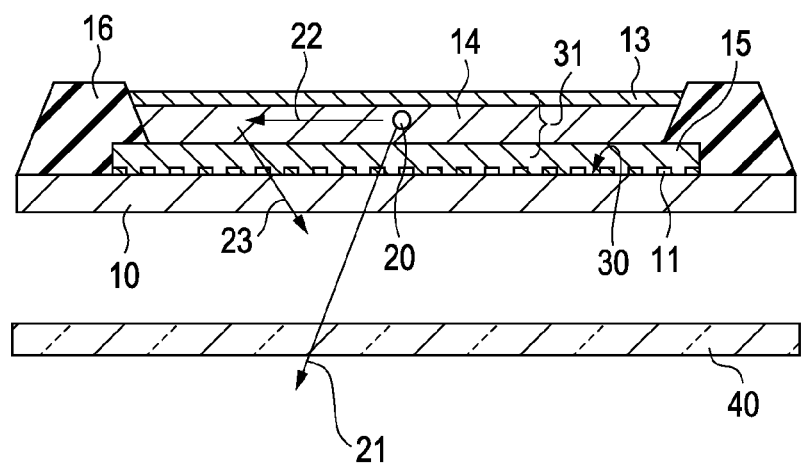
FIG. 3 is a sectional schematic view of another light emitting device used for a display apparatus according to an embodiment of the present invention.

The top-emission-type configuration in which light is extracted from a side of the device opposite the substrate has been described so far. However, the present invention may also employ the bottom-emission-type configuration in which light is extracted from the substrate side of the device. In this case, for example, the device configuration illustrated in FIG. 3 may be employed. Specifically, a periodic structure 30 having optical transmissivity is disposed on a substrate 10. A second electrode 15 also functioning as a planarizing layer is formed on the periodic structure 30. An organic compound layer 14 including a light emitting layer is formed on the second electrode 15. A first electrode 13 also functioning as a reflecting layer is formed on the organic compound layer 14. Light generated in the light emitting layer is extracted from the second electrode 15 side of the device. A circular polarizer 40 is provided on the substrate 10 side of the device, that is, the light extraction side. The periodic structure 30 has a period of more than 380/(n+1) nm and 380 nm or less where n represents the refractive index of the light emitting layer. The advantages of the present invention are also achieved in this device configuration. Additionally, since the periodic structure 30 is provided at a position closer to the substrate 10 with respect to the organic compound layer 14 including the light emitting layer, the production process of the periodic structure 30 does not damage the organic compound layer 14 and good light emission can be provided. The periodic structure 30 can be constituted by a metal thin film. The second electrode 15 can be composed of a transparent oxide conductive material such as ITO.

Another example of the device configuration according to the present invention is as follows. A second electrode, a light emitting layer, a first electrode, a periodic structure, and a reflecting layer are sequentially formed on a substrate. The reflecting plane is the interface between the first electrode and the reflecting layer. The periodic structure is formed in the reflecting plane. In summary, this device configuration includes the periodic structure in the reflecting plane closer to the first electrode with respect to the light emitting layer. This device configuration is also the bottom-emission-type configuration in which the substrate side of the device is the light extraction side and a circular polarizer is provided on the substrate side of the device. By making the periodic structure to have a period of more than 380/(n+1) nm and 380 nm or less where n represents the refractive index of the light emitting layer, the advantages of the present invention can be provided.

Figure 4:
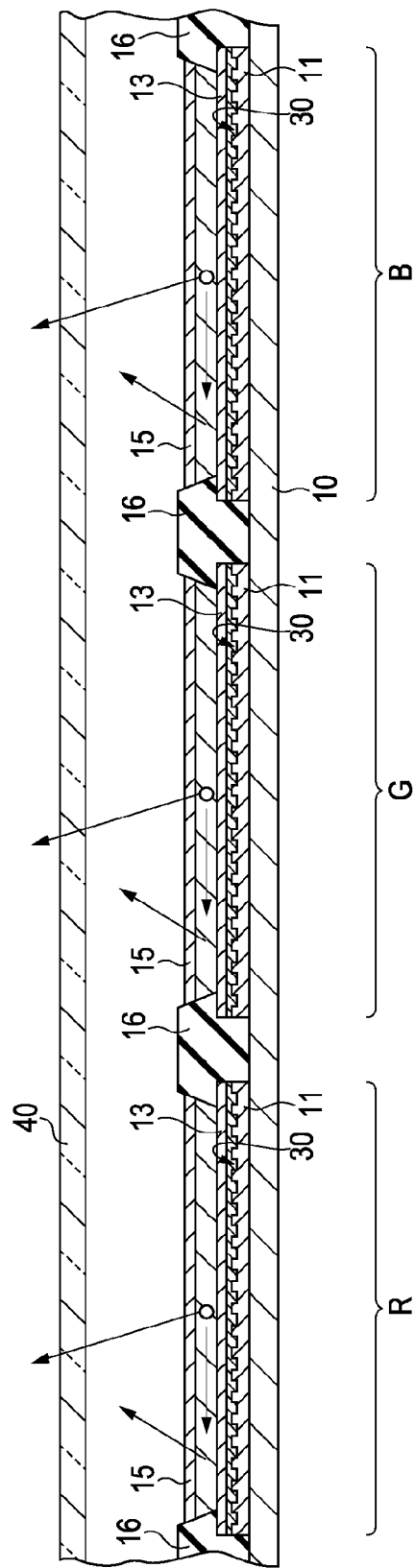
FIG. 4 is a sectional schematic view of a display apparatus according to an embodiment of the present invention.

Referring to FIG. 4, a display apparatus including a plurality of light emitting devices having one of the above-described configurations on a substrate can be provided. In particular, when a full-color display apparatus including a plurality of light emitting devices R emitting red light, a plurality of light emitting devices G emitting green light, and a plurality of light emitting devices B emitting blue light is produced, to facilitate the production, the periodic structures 30 of the light emitting devices R, G, and B can be formed so as to have the same configuration and have the same period. In the visible light region, red light corresponds to the wavelength region of 600 nm or more and 750 nm or less, green light corresponds to the wavelength region of 495 nm or more and 570 nm or less, and blue light corresponds to the wavelength region of 430 nm or more and 495 nm or less. In the display apparatus, to enhance the light extraction efficiency also in the red light emitting devices R corresponding to the largest wavelength, the periodic structures 30 (having the same configuration) of all the light emitting devices R, G, and B can be formed so as to have a period of more than 600/(n+1) nm where n represents the refractive index of the light emitting layers of the light emitting devices and n=1.6 to 2.0. Accordingly, to enhance the light extraction efficiency of all the light emitting devices R, G, and B and to provide a good function of suppressing reflection of ambient light, the periodic structures 30 (having the same configuration) of all the light emitting devices R, G, and B are desirably formed so as to have a period of more than 200 nm and 380 nm or less. More desirably, the periodic structures 30 have a period of more than 230 nm and 380 nm or less. When the periodic structures 30 are constituted by a square lattice, the periodic structures 30 desirably have a period of 270 nm (approximately equals 380/1.4) or less. To facilitate the production of the display apparatus, a single circular polarizer commonly used for the light emitting devices R, G, and B can be provided.

In the configuration illustrated in FIG. 4, each periodic structure 30 is provided on the reflecting layer 11 provided at a position closer to the first electrode 13 with respect to the light emitting layer. However, a configuration in which each periodic structure 30 is provided at a position closer to the second electrode 15, which is closer to the light extraction side of the device, with respect to the light emitting layer may also be employed. Although the periodic structures 30 are not provided between the light emitting devices R, G, and B in FIG. 4, a configuration in which the periodic structures 30 are provided between the light emitting devices R, G, and B (in lower portions of the partition walls 16) may also be employed. In this configuration, light having propagated to the partition walls 16 can be extracted to the outside and hence the light extraction efficiency can be enhanced.

EXAMPLES

Hereinafter, production methods of light emitting devices according to the present invention will be described as examples. However, the present invention is not restricted to these examples.

Example 1

An organic EL device having the configuration illustrated in FIG. 1A was produced by the following method. The periodic structure 30 was formed in the reflecting layer 11 on the substrate 10.

A positive resist was spin-coated on the substrate 10 composed of quartz and prebaked. After that, the resist was exposed with a KrF exposure system, developed, and postbaked so as to provide a resist pattern having the square-lattice period configuration illustrated in FIG. 1B. In EXAMPLE 1, the periodic structure 30 was made to have a period a of 200 nm and a diameter of 120 nm. The substrate 10 was subsequently subjected to dry etching to an etching depth of 40 nm. The resist was then removed. Thus, a periodic structure (not shown) was formed on the substrate 10. A film composed of an Al alloy (AlSi) and having a thickness of 100 nm was formed on the periodic structure by sputtering. Thus, the reflecting layer 11 in which the periodic structure 30 was provided was formed. If the reflecting layer 11 is formed so as to be flat without the periodic structure 30, the reflecting layer 11 serves as a high reflecting layer having a spectral reflectance of 70% or more in the visible light wavelength region ($\lambda$=380 nm or more and 780 nm or less). Other than such an Al alloy, the reflecting layer 11 may be composed of a Ag alloy or the like.

A SOG film having a thickness of 30 nm was subsequently formed as the planarizing layer 12 by spin coating to thereby form a flat surface over the irregularities of the periodic structure 30. An IZO (trademark) film having a thickness of 50 nm was subsequently formed by sputtering and patterned into an electrode. Thus, the first electrode (anode) 13 containing a photonic crystal (periodic structure 30) was formed.

The partition wall 16 composed of polyimide and having a film thickness of 1 μm was subsequently formed. An opening for constituting the light emitting region 32 illustrated in FIG. 1B was formed by etching to thereby expose the first electrode 13.

The thus-formed member was subjected to an ultrasonic cleaning with isopropyl alcohol (IPA), subsequently to boiling cleaning, and then to drying. The resultant member was then subjected to UV/ozone cleaning. The organic compound layer 14 was subsequently formed by vacuum deposition in the following manner.

First, a hole transport layer composed of Compound [I] represented by a structural formula below and having a film thickness of 55 nm was formed. In this film formation, the degree of vacuum was $1 \times 10^{-4}$ Pa and the deposition rate was 0.2 nm/sec.

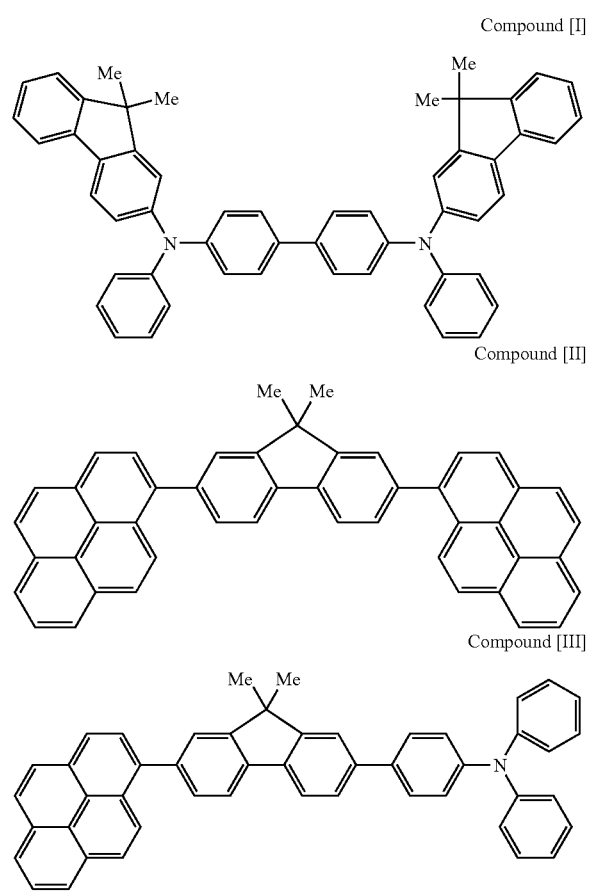

Second, a light emitting layer for emitting blue light was formed. Specifically, a film having a thickness of 35 nm was formed as the light emitting layer by codeposition of Compound [II] and Compound [III] (light emitting compound) serving as host materials and illustrated above. In this deposition, the degree of vacuum was $1 \times 10^{-4}$ Pa and the film-formation rate was 0.2 nm/sec.

Third, a film composed of 1,10-Bathophenanthroline (hereafter, referred to as Bphen) and having a thickness of 20 nm was formed as an electron transport layer by vacuum deposition. In this deposition, the degree of vacuum was $1 \times 10^{-4}$ Pa and the film-formation rate was 0.2 nm/sec. A film composed of Bphen and $Cs_2CO_3$ (90:10 on the weight basis) and having a thickness of 60 nm was formed by codeposition as an electron injection layer. In this deposition, the degree of vacuum was $3 \times 10^{-4}$ Pa and the film-formation rate was 0.2 nm/sec. The resultant substrate in which the electron injection layer had been formed was then moved into a sputtering system without removing the substrate from the vacuum atmosphere. An IZO film having a thickness of 30 nm was formed by sputtering as the second electrode 15 provided on the light extraction side of the device.

A hygroscopic agent was then placed so as to surround the thus-formed device. This device was then sealed with an etched cap glass (not shown). Finally, the circular polarizer 40 was bonded onto the cap glass with an adhesive agent. Thus, an organic EL device was obtained.

In summary, the organic EL device had a configuration in which the periodic structure was provided between the reflecting layer and the circular polarizer and the periodic structure had a period of 200 nm, which was less than 380 nm. Since the periodic structure 30 was formed in the reflecting layer 11 on the substrate 10 before the formation of the organic compound layer 14, damage to the organic compound layer 14 caused by the production process of the periodic structure 30 was suppressed.

Example 2

An organic EL device was produced as in EXAMPLE 1 except that the periodic structure 30 had a period a of 250 nm and a diameter of 150 nm.

Comparative Example 1

An organic EL device was produced as in EXAMPLE 1 except that the periodic structure 30 was not formed and the reflecting layer 11 was flat in FIG. 1A.

Comparative Example 2

An organic EL device was produced as in EXAMPLE 1 except that the periodic structure 30 had a period a of 1500 nm and a diameter of 900 nm.

Comparative Example 3

An organic EL device was produced as in EXAMPLE 1 except that the periodic structure 30 had a period a of 3000 nm and a diameter of 1500 nm.

Comparative Example 4

An organic EL device was produced as in EXAMPLE 1 up to the formation of an IZO film having a thickness of 30 nm as the second electrode 15 provided on the light extraction side of the device except that the periodic structure 30 was not formed and the reflecting layer 11 was flat in FIG. 1A. A diffusion structure (not shown) in which holes having a diameter of about 200 nm were randomly dispersed in a monolayer silicon oxynitride ($SiN_xO_y$) film on another substrate (not shown) was formed. The diffusion structure formed on the other substrate was disposed on the second electrode 15 with an epoxy resin. Finally, the circular polarizer 40 was bonded to the thus-formed member with an adhesive agent. Thus, an organic EL device was obtained.

Table 1 below shows measured values and relative values in terms of luminous reflectance $R_v$ in EXAMPLE 1 (P200 nm), EXAMPLE 2 (P250 nm), COMPARATIVE EXAMPLE 1 (without periodic structure), COMPARATIVE EXAMPLE 2 (P1500 nm), COMPARATIVE EXAMPLE 3 (P3000 nm), and COMPARATIVE EXAMPLE 4 (diffusion structure). The luminous reflectance $R_v$ is defined by Formula 9 with reflection spectrum R (λ), ambient light spectrum S (λ), and relative luminous efficiency V (λ). The measured values of luminous reflectance $R_v$ were values of luminous reflectance $R_v$ measured in a direction (forward direction X) perpendicular to the substrate 10 when an ambient light having an illuminance of 17,000 lx entered the device at an incident angle of 45°. The relative values were obtained with the value of COMPARATIVE EXAMPLE 1 serving as a reference. "P200 nm" indicates that the periodic structure 30 had a period a of 200 nm.

$$R_v = \frac{\int_{380}^{780} d\lambda R(\lambda) S(\lambda) V(\lambda)}{\int_{380}^{780} d\lambda S(\lambda) V(\lambda)} \quad \text{Formula 9}$$

Table 1 shows that the luminous reflectances of EXAMPLES 1 and 2 were almost the same as that of COMPARATIVE EXAMPLE 1 and hence a good function of suppressing reflection of ambient light can be maintained in EXAMPLES 1 and 2. In contrast, COMPARATIVE EXAMPLES 2 and 3 in which the periods of the periodic structures were larger than the wavelength of ambient light had 4 to 10 times the luminous reflectance of COMPARATIVE EXAMPLE 1. Thus, the function of suppressing reflection of ambient light is degraded in COMPARATIVE EXAMPLES 2 and 3. Similarly, COMPARATIVE EXAMPLE 4 in which the size of the diffusion structure was about equal to the sub-wavelength of ambient light but the structure was not periodic and was random had a luminous reflectance five times that of COMPARATIVE EXAMPLE 1. Thus, the function of suppressing reflection of ambient light is also degraded in COMPARATIVE EXAMPLE 4.

EXAMPLES 1 and 2 having the periodic structures had a light emitting efficiency 1.1 times that of COMPARATIVE EXAMPLE 1 and enhanced light extraction efficiency.

Therefore, the present invention can provide a light emitting device having high light extraction efficiency and a good function of suppressing reflection of ambient light.

TABLE 1

| | luminous reflectance | (relative value) |
|---|---|---|
| COMPARATIVE EXAMPLE 1 (without periodic structure) | 0.044% | 1.0 |
| EXAMPLE 1 (P200 nm) | 0.046% | 1.0 |
| EXAMPLE 2 (P250 nm) | 0.053% | 1.2 |
| COMPARATIVE EXAMPLE 2 (P1500 nm) | 0.466% | 10.6 |
| COMPARATIVE EXAMPLE 3 (P3000 nm) | 0.167% | 3.8 |
| COMPARATIVE EXAMPLE 4 (diffusion structure) | 0.228% | 5.2 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-116607 filed May 13, 2009, which is hereby incorporated by reference herein in its entirety.

What is claimed is:

1. A display apparatus comprising a substrate and a plurality of light emitting devices provided on the substrate and including a first electrode, a second electrode on a light extraction side of the light emitting devices, a light emitting layer between the first electrode and the second electrode, a periodic structure for extracting light generated in the light emitting layer from the light extraction side of the light emitting devices, and a circular polarizer provided on the light extraction side of the light emitting devices, wherein the periodic structure acts as a light extraction structure wherein the periodic structure functions as means for generating only zeroth-order diffracted light from light entering from outside and suppressing reflected light arising from ambient light, and wherein the refractive index of the periodic structure varies in an in-plane direction of the substrate.

2. The display apparatus according to claim 1, wherein the periodic structure is provided at a position closer to the substrate with respect to the light emitting layer.

3. The display apparatus according to claim 1, wherein the periodic structure is provided in a reflecting plane closer to the first electrode with respect to the light emitting layer.

4. The display apparatus according to claim 1, wherein the period of the periodic structure is more than 230 nm and 380 nm or less.

5. The display apparatus according to claim 1, wherein the period of the periodic structure is more than 200 nm and 380 nm or less.

6. The display apparatus according to claim 1, wherein the plurality of light emitting devices include a light emitting device emitting red light, a light emitting device emitting green light, and a light emitting device emitting blue light.

7. The display apparatus according to claim 1, wherein each period of the periodic structure of the plurality of light emitting devices is identical.

8. A display apparatus comprising a substrate and a plurality of light emitting devices provided on the substrate and including a first electrode, a second electrode on a light extraction side of the light emitting devices, a light emitting layer between the first electrode and the second electrode, a periodic structure for extracting light generated in the light emitting layer from the light extraction side of the light emitting devices, and a circular polarizer provided on the light extraction side of the light emitting devices, wherein the periodic structure acts as a light extraction structure having a period in which reflected light that arises from an ambient light is suppressed, wherein the period of the periodic structure satisfies λ/(n+1)<a≦λ, λ is maximum peak wavelength in the spectrum of the light extracted from the light emitting device and n is refractive index of the light emitting layer, and wherein the refractive index of the periodic structure varies in an in-plane direction of the substrate.

9. The display apparatus according to claim 8, wherein the periodic structure is provided at a position closer to the substrate with respect to the light emitting layer.

10. The display apparatus according to claim 8, wherein the periodic structure is provided in a reflecting plane closer to the first electrode with respect to the light emitting layer.

11. The display apparatus according to claim 8, wherein the period of the periodic structure is more than 230 nm and 380 nm or less.

12. The display apparatus according to claim 8, wherein the period of the periodic structure is more than 200 nm and 380 nm or less.

13. The display apparatus according to claim 8, wherein the plurality of light emitting devices include a light emitting device emitting red light, a light emitting device emitting green light, and a light emitting device emitting blue light.

14. The display apparatus according to claim 8, wherein each period of the periodic structure of the plurality of light emitting devices is identical.

* * * * *